United States Patent
Purohit

(10) Patent No.: US 7,385,799 B1
(45) Date of Patent: Jun. 10, 2008

(54) OFFSET PHASE OPERATION ON A MULTIPHASE AC ELECTROSTATIC CLAMP

(75) Inventor: Ashwin M. Purohit, Gloucester, MA (US)

(73) Assignee: Axcelis Technology, Inc., Beverly, MA (US)

( * ) Notice: Subject to any disclaimer, the term of this patent is extended or adjusted under 35 U.S.C. 154(b) by 0 days.

(21) Appl. No.: 11/703,427

(22) Filed: Feb. 7, 2007

(51) Int. Cl.
H01L 39/00 (2006.01)

(52) U.S. Cl. .................................................. 361/234

(58) Field of Classification Search .................. 361/234
See application file for complete search history.

(56) References Cited

U.S. PATENT DOCUMENTS

| | | | |
|---|---|---|---|
| 5,452,177 A | 9/1995 | Frutiger | |
| 5,684,669 A * | 11/1997 | Collins et al. | 361/234 |
| 6,307,728 B1 * | 10/2001 | Leeser | 361/234 |
| 6,388,861 B1 | 5/2002 | Frutiger | |
| 6,625,003 B2 * | 9/2003 | Loo et al. | 361/234 |
| 7,209,339 B2 * | 4/2007 | Kitabayashi et al. | 361/234 |

* cited by examiner

*Primary Examiner*—Michael J Sherry
*Assistant Examiner*—Christopher J Clark
(74) *Attorney, Agent, or Firm*—Eschweiler & Associates, LLC

(57) ABSTRACT

A method for clamping a workpiece is provided, wherein a workpiece is placed on a surface of a clamping plate of a multi-polar electrostatic clamp having a plurality of electrodes. A plurality of phases of the AC clamping voltage are applied to the plurality of electrodes, wherein at least one of the plurality of phases of the AC clamping voltage applied to at least one of the plurality of electrodes is shifted with respect to the remaining plurality of phases by an offset phase shift. A fluctuation in clamping force between the clamping plate and the workpiece during a cycle of the at least one of the plurality of phases of AC clamping voltage is determined, and the offset phase shift is controlled, based, at least in part, on the determined fluctuation in clamping force, an RC time constant of the clamping system, and a set of performance criteria.

25 Claims, 4 Drawing Sheets

US 7,385,799 B1

OFFSET PHASE OPERATION ON A MULTIPHASE AC ELECTROSTATIC CLAMP

FIELD OF THE INVENTION

The present invention relates generally to workpiece processing systems and methods for processing workpieces, and more specifically to a method for electrostatically clamping workpieces using a phase-shifted AC waveform.

BACKGROUND OF THE INVENTION

Electrostatic clamps or chucks (ESCs) are commonly implemented to hold workpieces in plasma-based or vacuum-based semiconductor processes such as etching, CVD, and ion implantation, etc. Capabilities of the ESCs, including non-edge exclusion and workpiece temperature control, have proven to be quite valuable in processing semiconductor substrates, such as silicon wafers. A typical ESC, for example, comprises a dielectric layer positioned over a conductive electrode, wherein the semiconductor wafer or workpiece is placed on a surface of the ESC (e.g., the workpiece is placed on a surface of the dielectric layer). During semiconductor processing (e.g., ion implantation), a clamping voltage is typically applied between the workpiece and the electrode, wherein the workpiece is clamped against the chuck surface by electrostatic forces.

De-clamping or un-sticking the workpiece from the chuck surface, however, is a concern in many ESC applications. For example, after the clamping voltage is turned off, the workpiece typically "sticks" to the chuck surface for a considerable amount of time, wherein the workpiece cannot be removed by typical workpiece lifting mechanisms (e.g., pins extending through the ESC which are configured to lift the workpiece from the surface of the dielectric layer). This workpiece de-clamping problem can reduce the throughput of the process. It is believed that the de-clamping problem occurs when residual charges induced by the clamping voltage remain on the dielectric layer or on a surface of the workpiece, therein leading to an undesirable electric field and clamping force. According to a charge migration model, residual charges are caused by charge migration and accumulation during clamping, wherein the charges accumulate at the dielectric surface and/or workpiece backside (e.g., when the workpiece surface comprises an insulating layer).

An RC time constant, for example, can be used to characterize the charge/discharge times which correspond to an amount of time typically required to respectively clamp or de-clamp the workpiece. Conventionally, this time constant is determined by the product of a volume resistance of the dielectric layer and a gap capacitance between the wafer and dielectric surfaces, i.e., $$RC = R_{die}C_{gap} = \rho(dielectric)\varepsilon_0\varepsilon_r \frac{d(dielectric)}{gap} \quad (1)$$

where $R_{die}$ is the resistance of the dielectric layer, $C_{gap}$ is the capacitance of the gap between the wafer and the chuck surface, $\rho(dielectric)$ is the volume resistivity of the dielectric layer, $\varepsilon_0$ is the free space permittivity, $\varepsilon_r$ is the dielectric constant of the gap, $d(dielectric)$ is the thickness of the dielectric layer, and gap is the distance between the dielectric and workpiece surfaces. Thus, depending on the dielectric chosen, the gap, and other factors, the clamping and de-clamping times can be significantly long. A variety of techniques have been conventionally used for reducing workpiece de-clamping problems encountered in the use of ESCs. For example, one conventional technique involves applying a reversal voltage before the workpiece is removed from the ESC, therein eliminating a residual attractive force. This reversal voltage, however, is typically 1.5 to 2 times higher than the clamping voltage, and the de-clamping time is still typically quite large.

Another conventional technique involves providing a low-frequency sinusoidal or square-wave AC clamping voltages to a plurality of electrodes in order to produce wave fields of controlled amplitude and phase. However, in utilizing a sinusoidal AC clamping voltage, the voltage applied to the ESC oscillates between positive and negative voltage, thus passing through zero volts during the oscillation. When passing through zero volts, the clamping force applied to the workpiece is diminished, and a deleterious vibration or "fluttering" of the workpiece with respect to the ESC can be observed, wherein the workpiece can potentially separate from the ESC. In order to alleviate some of the vibration, multiple electrodes have been utilized, wherein a phase clamping voltage applied to each of the electrodes is offset by an amount proportionate to the number of phases provided.

Such a technique is disclosed in U.S. Pat. No. 5,452,177, issued Sep. 19, 1995 to Frutiger, wherein six electrodes are provided. The electrodes disclosed by Frutiger are symmetrically disposed with respect to the center of a clamping surface of a platen, thus defining pairs of electrodes. The voltages applied to the two electrodes of each pair are one-half cycle, or 180 degrees, out of phase with one another. As such, a time exists when the polarity of each pair crosses zero volts, and each pair of electrodes respectively loses clamping force. To alleviate this loss of clamping force, Frutiger further offsets each pair of electrodes by 120 degrees from each other, thus providing two pairs of electrodes that have non-zero voltages applied thereto at the time when the remaining pair crosses zero volts.

Electrostatic clamping systems comprising an ESC having a plurality of electrodes or poles, however, continue to suffer from deleteriously decreased clamping forces associated with the crossing of zero volts when using an AC waveform, even when the conventional proportional phase shifts are implemented. Conventionally, the phase shifts are determined by equally dividing the phase cycle by the number of electrodes in the ESC. For example, a three-electrode ESC will conventionally shift the phase of AC voltage applied to each electrode by 120 degrees, since 120 degrees is exactly one-third of a full cycle. In the six-electrode ESC discussed previously, the phases of AC voltage differ by 60 degrees (a 180 degree shift for each pair, wherein each pair is further shifted from the other pairs by 120 degrees). Such conventional equally-spaced phase shifting, however, does not take into account various other factors associated with the clamping system, such as the RC time constant associated with the entire system, and insufficient clamping force to the workpiece can continue to exist.

Therefore, a need exists in the art for a method for optimizing electrostatic clamping of workpieces in a multiple-electrode ESC, wherein various properties of the electrostatic clamping system are taken into account when determining a phase shift.

SUMMARY OF THE INVENTION

The present invention overcomes the limitations of the prior art by providing a method for optimally controlling a phase shift in an AC multi-polar electrostatic clamp. More particularly, the present invention provides a method for optimally clamping workpieces, wherein clamping forces applied to the workpiece are maintained at a more consistent level than previously seen in the art. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward a method for electrostatically clamping a workpiece to an AC-driven electrostatic clamp or chuck. The method comprises providing a clamping system having a multi-polar electrostatic clamp and a power source, wherein the multi-polar electrostatic clamp comprises a clamping plate and a plurality of electrodes. In accordance with the invention, the electrostatic clamping system further comprises one or more electrical components electrically connected between the power source and the plurality of electrodes, wherein the one or more electrical components may comprise one or more of a wire, amplifier, rectifier, transformer, capacitor, and resistor. Thus electrostatic clamping system has an RC time constant associated therewith, wherein the RC time constant of the electrostatic clamping system comprises a total of RC time constants associated with the multi-polar electrostatic clamp, the power source, and the one or more electrical components. Furthermore, the multi-polar electrostatic clamp may comprise a bi-polar clamp, tri-polar clamp, or any electrostatic clamp having more than two phases of AC clamping voltage applied thereto.

In accordance with one exemplary aspect of the invention, the workpiece is placed on a surface of the clamping plate, and a plurality of phases of the AC clamping voltage are applied to the plurality of electrodes via the power source. At least one of the plurality of phases of the AC clamping voltages applied to at least one of the plurality of electrodes, for example, is shifted in time with respect to the remaining of the plurality of phases by an offset phase shift. The AC clamping voltage, for example, comprises a bipolar AC square wave, wherein the at least one of the plurality of phases is shifted in time with respect to the remaining of the plurality of phases by the offset phase shift. According to one example, the offset phase shift is not equal to m×(360/n), where n is the number of electrodes, and m is a positive integer.

According to one exemplary aspect of the invention, a variation or fluctuation in clamping force between the clamping plate and the workpiece is further determined during a complete cycle of the AC clamping voltage, such as during the cycle of the at least one of the plurality of phases. The determination of the fluctuation in clamping force, for example, comprises measuring a force and/or a movement between the workpiece and the clamping plate with respect to time during the cycle of the AC clamping voltage. The offset phase shift of the at least one of the plurality of phases of the AC clamping voltage is further controlled, based, at least in part, on the determined fluctuation in clamping force, the RC time constant of the clamping system, and a set of performance criteria. The set of performance criteria, for example, comprises a desired minimum movement of the workpiece with respect to the clamping plate, and/or a desired maximum amount of time associated with a de-clamping of the workpiece from the clamping plate.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
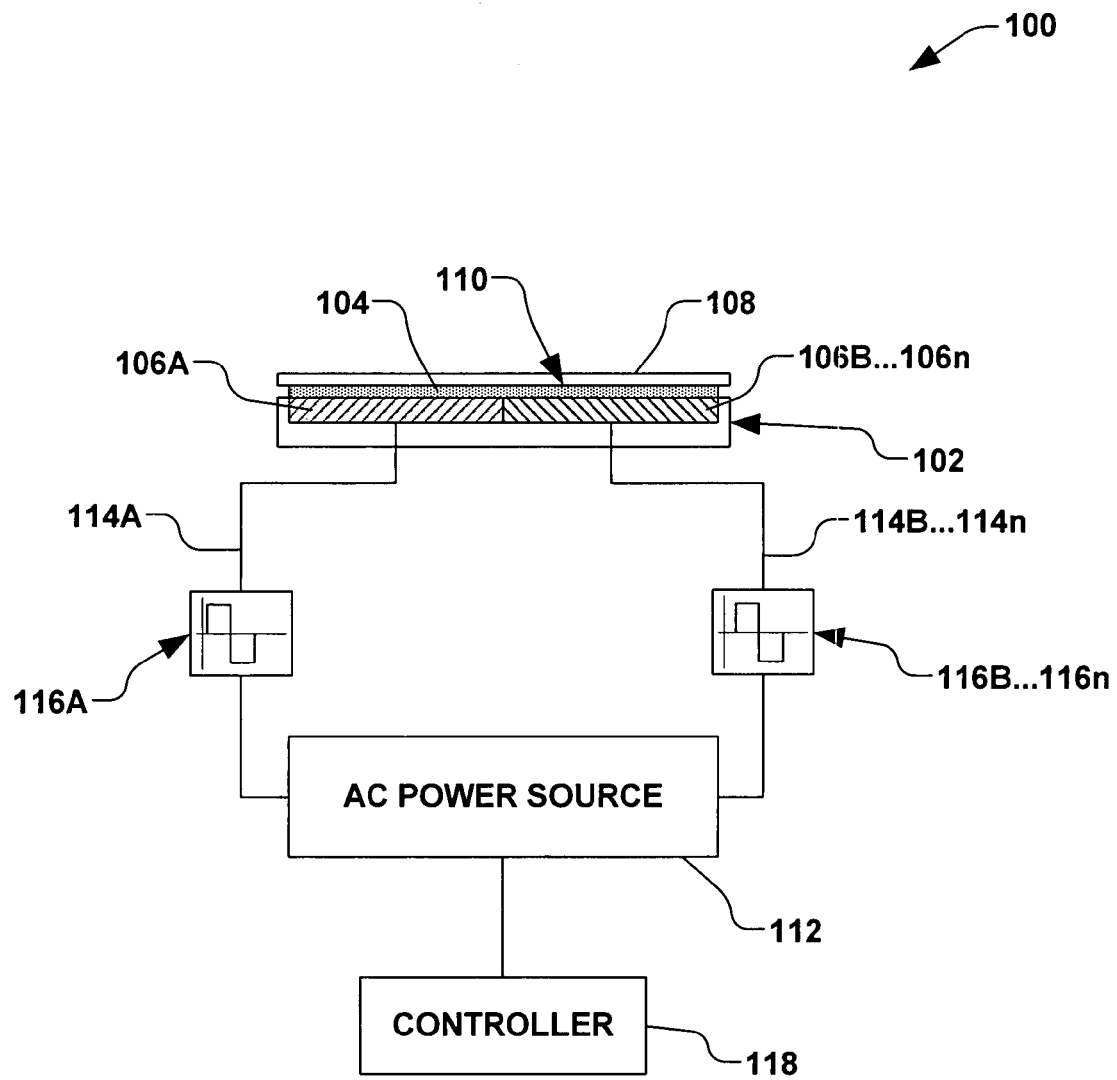
FIG. 1 is a block diagram of an exemplary multi-polar electrostatic clamping system in accordance with one aspect of the present invention.

The present invention is directed generally toward a method for clamping workpieces to an electrostatic clamp or chuck (ESC), and more particularly, to a method for providing a more uniform clamping force to the workpiece. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, in order to gain a better understanding of the invention, FIG. 1 illustrates an exemplary electrostatic clamping system 100, wherein several inventive aspects of the present invention will now be described. The electrostatic clamping system 100, for example, comprises a multi-polar electrostatic clamp (ESC) 102, wherein the multi-polar electrostatic clamp comprises a clamping plate 104 having a plurality of clamping electrodes 106A, 106B . . . 106n associated therewith, wherein n is a positive integer greater than one. The clamping plate 104, for example, is comprised of a dielectric material. The ESC 102 is configured to electrostatically attract a workpiece 108 to a surface 110 of the clamping plate via electrostatic forces induced between the ESC and the workpiece. In the present example, each of the plurality of clamping electrodes 106A, 106B . . . 106n is electrically connected to an AC power source 112 via a respective plurality of electrical connections 114A, 114B . . . 114n wherein the AC power source is operable to provide a respective plurality of AC clamping voltage waveforms or phases 116A, 116B ... 116n to the plurality of clamping electrodes 106A, 106B ... 106n.

Each of the plurality of AC clamping voltage phases 116A, 116B ... 116n, for example, differs with respect to the remaining AC clamping voltage waveforms, wherein each phase is unique. For example, each out the plurality of AC clamping voltage phases 116A, 116B ... 116n is out of phase with respect to the remaining AC clamping, voltage phases or waveforms, therein providing multiple phases or poles of the multi-polar ESC 102 (also called a multi-phase ESC). The electrostatic clamping system 100 further comprises a controller 118 configured to control the AC power source 110 and plurality of AC clamping voltage phases 116A, 116B ... 1116n, as will be described infra.

The plurality of clamping electrodes 106 of the multi-polar ESC 102 of FIG. 1 may be arranged in any number of different manners, wherein multiple poles or pole configurations can be attained. For example, a bi-polar ESC 121 is illustrated in plan view in FIG. 2, wherein a first clamping electrode 122 has a first waveform or phase 123 applied thereto, and a second clamping electrode 124 has a second waveform or phase 125 further applied thereto. In the present example, the first clamping electrode 122 comprises a first plurality of members 126A, 126B, and 126C, while the second clamping electrode 124 comprises a second plurality of members 128A, 128B, and 128C, respectively. The first plurality of members 126A, 126B, and 126C of the first clamping electrode 122, for example, are generally interleaved with respect to the second plurality of members 128A, 128B, and 128C of the second clamping electrode 124.

Figure 2:
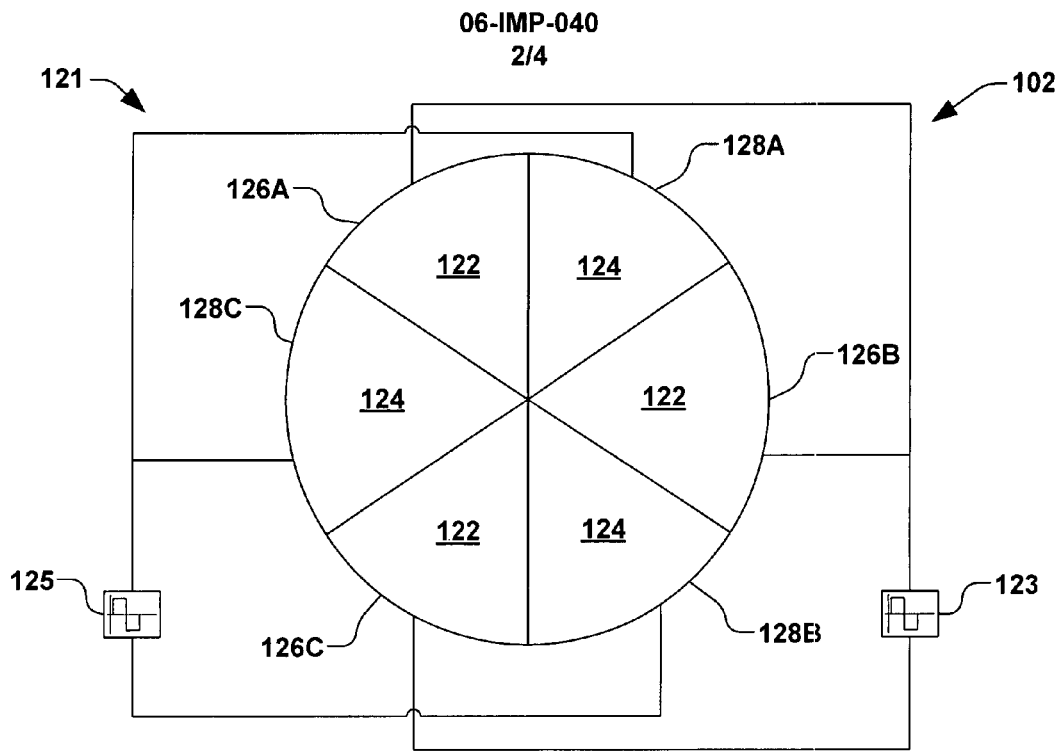
FIG. 2 illustrates a plan view of an exemplary multi-polar electrostatic clamp in accordance with another aspect of the invention.
Figure 3:
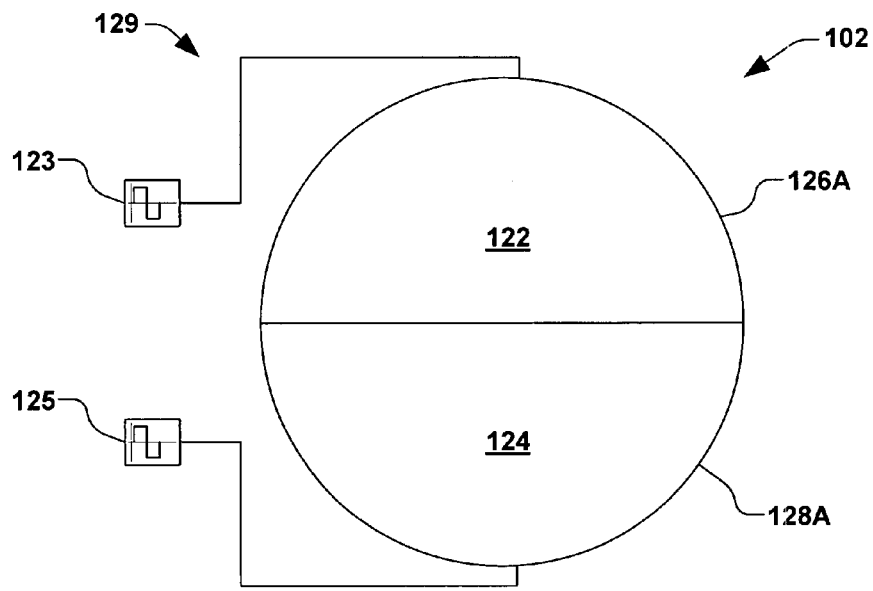
FIG. 3 illustrates a plan view of a bi-polar electrostatic clamp in accordance with yet another exemplary aspect of the present invention.

Alternatively, another exemplary bi-polar ESC 129 is illustrated in FIG. 3, wherein the first clamping electrode 122 and second clamping electrode 124 each comprise a respective single member 126A and 128A. Thus, it should be understood that any number and arrangement of the plurality of clamping electrodes 106 of FIG. 1 and/or the first clamping electrode 122 and second clamping electrode 124 of FIGS. 2 and 3 can be implemented according to the present invention, and all such arrangements are contemplated as falling within the scope of the present invention.

Figure 4:
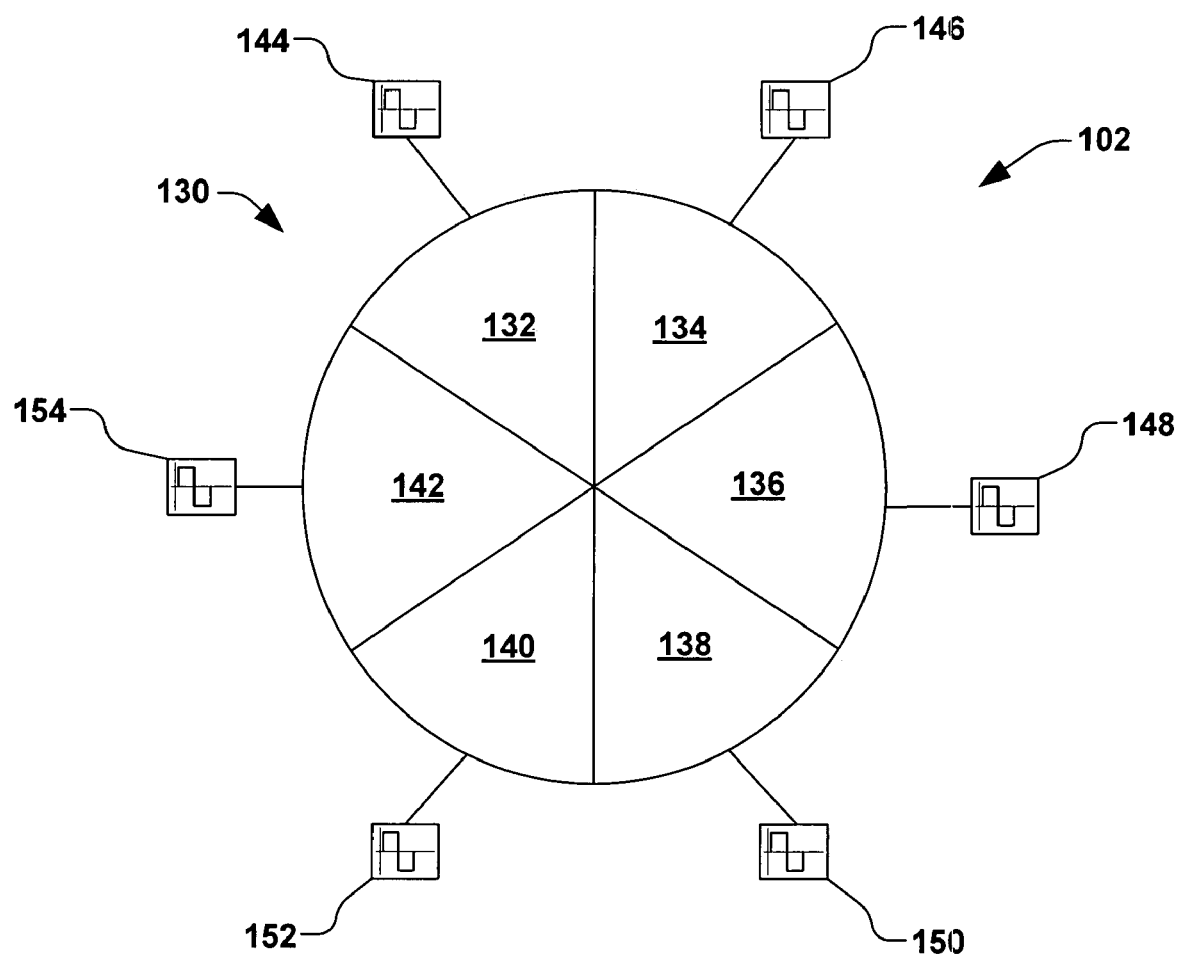
FIG. 4 illustrates a plan view of yet another exemplary multi-polar electrostatic clamp according to still another aspect of the invention.

FIG. 4 illustrates an exemplary 6-phase ESC 130, wherein the plurality of electrodes 106 of FIG. 1 are comprised of a first electrode 132, second electrode 134, third electrode 136, fourth electrode 138, fifth electrode 140, and sixth electrode 142, wherein each of the first, second, third, fourth, fifth, and sixth electrodes are individually electrically connected to the power source 112 of FIG. 1. In such a case, the power source 112 of FIG. 1 is configured to respectively provide the six-phase, clamp 130 of FIG. 4 with a first waveform 144, second waveform 146, third waveform 148, fourth waveform 150, fifth waveform 152, and sixth waveform 154 of the AC clamping voltage to the first electrode 132, second electrode 134, third electrode 136, fourth electrode 138, fifth electrode 140, and sixth electrode 142. Again, it should be noted that any number n of electrodes 106 of FIG. 1 greater than one is contemplated as falling within the scope of the present invention.

Figure 5:
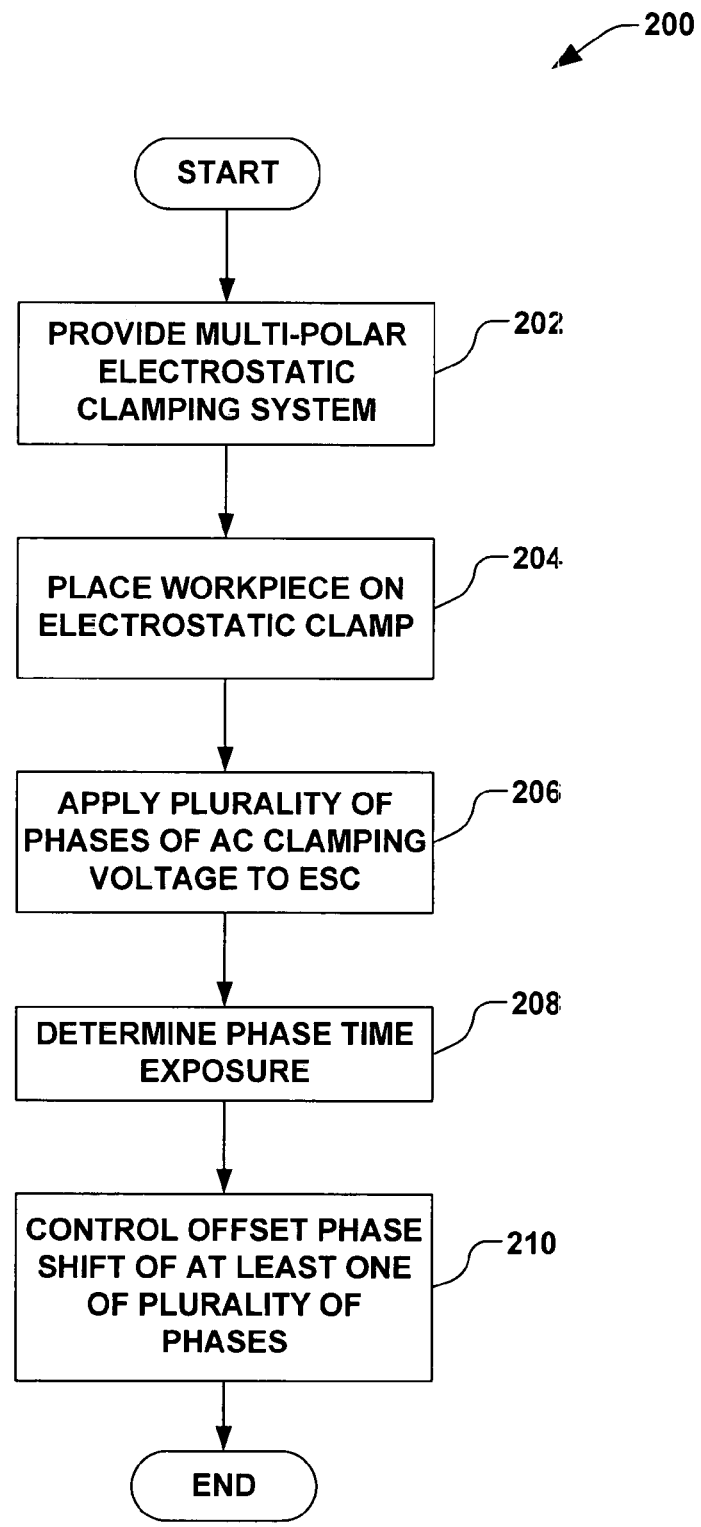
FIG. 5 is a block diagram illustrating an exemplary method for electrostatically clamping a workpiece to an AC-driven electrostatic clamp according to another exemplary aspect of the invention.

Thus, in accordance with the present invention, FIG. 5 illustrates an exemplary method 200 for optimally clamping a workpiece utilizing a multi-polar electrostatic clamp. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 5, the method 200 begins with providing a clamping system comprising a multi-polar electrostatic clamp and a power source in act 202. For example, act 202 may comprise providing the electrostatic clamping system 100 of FIG. 1. The multi-polar electrostatic clamp provided in act 202 of FIG. 5, for example, comprises a clamping plate and an associated plurality of n electrodes, wherein the plurality of electrodes generally define a plurality of poles of the ESC. It should be noted that the multi-polar electrostatic clamp provided in act 202 may comprise a Johnsen-Rahbek (J-R) clamp or a Coulombic clamp. In act 204, a workpiece is placed on a surface of the clamping plate, and a plurality of phases of an AC clamping voltage (e.g., a plurality of the AC clamping voltage waveforms) are applied to the plurality of electrodes of the multi-polar ESC via the power source in act 206, therein providing a clamping force to the workpiece via the ESC. Furthermore, it should be noted that the AC power source or power supply can comprise a plurality of power supplies configured to provide the plurality of phases of the AC clamping voltage waveforms. The AC clamping voltage waveforms or phases applied to the plurality of electrodes, for example, comprise bipolar AC square waves or other AC waveforms. Two or more of the plurality of phases of the AC clamping voltage waveforms may be similar to each other (e.g., two or more of the plurality of AC clamping voltage waveforms have similar phases).

In accordance with the present invention, at least one of the plurality of phases of the AC clamping voltage that is applied to at least one of the n electrodes is shifted in phase with respect to the remaining plurality of phases in act 206, therein defining an offset phase shift. According to one exemplary aspect, the offset phase shift is not equal to m×(360/n), where in is a positive integer. Thus, the offset phase shift is unique and generally not proportional to the number n of electrodes or phases. The offset phase shift, for example, can be a predetermined shift in phase based on the plurality of n electrodes and a set of test data, or the offset phase shift can be an arbitrary shift in phase, as long as the offset phase shift is not equal to m×(360/n).

In the exemplary bi-polar ESC 125 of FIG. 2, for example, the first clamping-electrode 122 is offset in-phase from the second clamping electrode 124 by the offset phase shift, wherein the offset phase shift is a non-zero value not equal to 180 degrees. In another example, at least one of the first electrode 132, second electrode 134, third electrode 136, fourth electrode 138, fifth electrode 140, and sixth electrode 142 of the exemplary six-pole or six-phase ESC 130 of FIG. 4, is shifted in phase with respect to the remaining electrodes by the offset phase shift, wherein the offset phase shift is a non-zero value not equal to an integer multiple of 60 degrees.

During the clamping of act 206, for example, a variation or fluctuation in clamping force between the clamping plate and the workpiece is determined in act 208, wherein the determination of the fluctuation is made during at least one cycle of the at least one phase of AC clamping voltage being applied to the respective electrode having the offset phase shift associated therewith. The variation in clamping force between the clamping plate and the workpiece, for example, is generally a result of the at least one phase of the plurality of AC clamping voltages changing polarity (e.g., the voltage passes through zero volts). In one example, a phase time exposure (PTE) is determined during the cycle of the at least one phase, wherein the clamping force and/or a movement between the clamping plate and the workpiece is measured with respect to time throughout the cycle of the AC clamping voltage.

In act 210, the offset phase shift of the AC clamping voltage is controlled, based, at least in part, on the determined fluctuation in clamping force, a set of performance criteria, and an RC time constant of the clamping system. The set of performance criteria, for example, may comprise a desired minimum clamping force and/or a desired minimum movement between the workpiece and the clamping plate. The set of performance criteria may further or alternatively comprise a desired maximum amount of time associated with a de-clamping of the workpiece from the clamping plate.

In accordance with another exemplary aspect of the present invention, as described above, the electrostatic clamping system can comprise one or more electrical components, such as one or more of a wire, amplifier, rectifier, transformer, capacitor, and resistor, electrically connected between the power source and the plurality of electrodes. Accordingly, the RC time constant of the clamping system comprises a generally cumulative RC time constant of one or more of the multi-polar electrostatic clamp, the power source, and the one or more electrical components. The RC time constant of the multi-polar electrostatic clamp, for example, comprises an RC time constant associated with a dielectric layer of the clamping plate. In accordance with the invention, it is important that the RC time constant of the clamping system as a whole, as opposed to simply the RC time constant of the clamping plate alone, is utilized in the control of the offset phase shift of act 210. For example, the RC time constant of both the multi-polar electrostatic clamp and the power source, as well as RC time constants of any electrical components therebetween, can have a significant impact the determination of the offset phase shift of act 210. Thus, according to the present example, the offset phase shift is not determined merely on the number of clamping electrodes. Rather, the offset phase shift is generally determined based on the system as a whole and its performance characteristics, such as clamping force.

In accordance with another example, the multi-polar electrostatic clamp provided in act 202 comprises a bi-polar electrostatic clamp, wherein the plurality of electrodes are comprised of a first electrode and a second electrode as described above. The application of the AC clamping voltage in act 206 thus comprises applying a first phase of the AC clamping voltage to the first electrode and applying a second phase of the AC clamping voltage to the second electrode, wherein the first phase and second phase are offset in time from one another by the offset phase shift that is not equal to 180 degrees. Each of the first electrode and the second electrode, for example, may comprise a plurality of members, wherein the plurality of members of the first electrode can be interleaved with respect to plurality of members of the second electrode, or alternatively, the plurality of members of the first electrode and plurality of members of the second electrode can be with grouped with respect to one another.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for clamping a workpiece, the method comprising:
    providing a clamping system comprising a multi-polar electrostatic clamp and a power source, wherein the multi-polar electrostatic clamp comprises a clamping plate and a plurality of electrodes;
    placing the workpiece on a surface of the clamping plate;
    applying a plurality of phases of an AC clamping voltage to the plurality of electrodes via the power source, wherein at least one of the plurality of phases of the AC clamping voltage applied to at least one of the plurality of electrodes is shifted with respect to the remaining of the plurality of phases by an offset phase shift;
    determining a fluctuation in clamping force between the clamping plate and the workpiece during a cycle of the AC clamping voltage; and
    controlling the offset phase shift, based; at least in part, on the determined fluctuation in clamping force, an RC time constant of the clamping system, and a set of performance criteria.

2. The method of claim 1, wherein determining the fluctuation in clamping force comprises measuring a force between the workpiece and the clamping plate with respect to time during the cycle of the AC clamping voltage.

3. The method of claim 2, wherein the set of performance criteria comprises a desired minimum clamping force between the workpiece and the clamping plate.

4. The method of claim 1, wherein determining the fluctuation in clamping force comprises measuring a movement of the workpiece with respect to time during the cycle of the AC clamping voltage.

5. The method of claim 4, wherein the set of performance criteria comprises a desired minimum movement of the workpiece with respect to the clamping plate.

6. The method of claim 1, wherein the set of performance criteria comprises a desired maximum amount of time associated with a de-clamping of the workpiece from the clamping plate.

7. The method of claim 1, wherein the electrostatic clamping system further comprises one or more electrical components electrically connected between the power source and the plurality of electrodes.

8. The method of claim 7, wherein the one or more electrical components comprise one or more of a wire, amplifier, rectifier, transformer, capacitor, and resistor.

9. The method of claim 7, wherein the RC time constant of the clamping system comprises a cumulative RC time constant of the multi-polar electrostatic clamp, the power source, and the one or more electrical components.

10. The method of claim 9, wherein the RC time constant of the multi-polar electrostatic clamp comprises an RC time constant associated with a dielectric layer of the clamping plate.

11. The method of claim 1, wherein the RC time constant of the clamping system comprises a cumulative RC time constant of the multi-polar electrostatic clamp and the power source.

12. The method of claim 1, wherein the multi-polar electrostatic clamp comprises a bi-polar electrostatic clamp, wherein the plurality of electrodes are comprised of a first electrode and a second electrode, and wherein applying the AC clamping voltage comprises applying a first phase of the AC clamping voltage to the first electrode and applying a second phase of the AC clamping voltage to the second electrode, wherein the first phase and second phase are offset in time from one another by the offset phase shift.

13. The method of claim 12, wherein each of the first electrode and the second electrode comprise a plurality of members, wherein the plurality of members of the first electrode are interleaved with respect to plurality of members of the second electrode.

14. The method of claim 1, wherein the AC clamping voltage comprises a bipolar AC square wave.

15. The method of claim 1, wherein the plurality of electrodes comprises n electrodes, wherein the offset phase shift is not equal to m×(360/n), where m is a positive integer.

16. The method of claim 15, wherein only one of the n electrodes is shifted in phase with respect to the remaining of the plurality of phases by the offset phase shift.

17. A method for electrostatically clamping a workpiece, the method comprising:
providing a multi-polar electrostatic clamp having n electrodes associated with a clamping plate, where n is a positive integer greater than one;
providing a set of performance criteria associated with electrostatically clamping the workpiece to the clamping plate;
applying a plurality of phases of an AC clamping voltage to the n electrodes, therein electrostatically clamping the workpiece to the clamping plate, wherein each of the plurality of phases of the AC clamping voltage has a phase shift associated therewith, and wherein one of the plurality of phases applied to one of the n electrodes is shifted from the remaining plurality of phases by an offset phase shift, wherein the offset phase shift is not equal to m×(360/n), where m is a positive integer;
determining a phase time exposure between the workpiece and the multi-polar electrostatic clamp, wherein the phase time exposure is associated with an amount of time during which the workpiece is concurrently exposed to a first polarity of the plurality of phases of the AC clamping voltage; and
controlling the offset phase shift based, at least in part, on the determined phase time exposure, and the set of performance criteria.

18. The method of claim 17, wherein the set of performance criteria comprise one or more of a desired minimum clamping force between the workpiece and the clamping plate and a desired minimum movement of the workpiece with respect to the clamping plate.

19. The method of claim 17, wherein determining the phase time exposure between the workpiece and the multi-polar electrostatic clamp comprises measuring a clamping force between the workpiece and the clamping plate with respect to time during a cycle of one the plurality of phases of the AC clamping voltage.

20. The method of claim 17, wherein determining the phase time exposure between the workpiece and the multi-polar electrostatic clamp comprises measuring a movement of the workpiece with respect to time during a cycle of one the plurality of phases of the AC clamping voltage.

21. The method of claim 17, wherein the multi-polar electrostatic clamp is part of a clamping system, wherein the clamping system comprises an AC power source configured to provide the plurality of phases of the AC clamping voltage, and one or more electrical components electrically connected between the AC power source and the plurality of clamping electrodes.

22. The method of claim 21, wherein determining the phase time exposure between the workpiece and the multi-polar electrostatic clamp is further associated with an RC time constant of the clamping system, wherein the RC time constant of the clamping system comprises an RC time constant of the multi-polar electrostatic clamp, an RC time constant of the AC power source, and an RC time constant of the one or more electrical components.

23. A method for clamping a workpiece, the method comprising:
providing a clamping system comprising a multi-polar electrostatic clamp and a power source, wherein the multi-polar electrostatic clamp comprises a clamping plate and n electrodes, where n is a positive integer greater than one;
placing the workpiece on a surface of the clamping plate;
applying a plurality of phases of an AC clamping voltage to the n electrodes via the power source, wherein at least one of the plurality of phases of the AC clamping voltage applied to at least one of the n electrodes is shifted with respect to the remaining of the plurality of phases by an offset phase shift, wherein the offset phase shift is not equal to m×(360/n), where m is a positive integer.

24. The method of claim 23, wherein the AC clamping voltage comprises a bipolar AC square wave.

25. The method of claim 23, wherein only one of the plurality of phases is shifted in phase with respect to the remaining of the plurality of phases by the offset phase shift.

* * * * *